United States Patent
Chen et al.

(10) Patent No.: US 12,342,730 B2
(45) Date of Patent: Jun. 24, 2025

(54) MAGNETIC TUNNEL JUNCTION STRUCTURES WITH PROTECTION OUTER LAYERS

(71) Applicant: Taiwan Semiconductor Manufacturing Co., Ltd., Hsinchu (TW)

(72) Inventors: Sheng-Chang Chen, Hsinchu (TW); Harry-Hak-Lay Chuang, Hsinchu (TW); Hung Cho Wang, Hsinchu (TW); Sheng-Huang Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 415 days.

(21) Appl. No.: 17/119,958

(22) Filed: Dec. 11, 2020

(65) Prior Publication Data

US 2021/0273156 A1 Sep. 2, 2021

Related U.S. Application Data

(60) Provisional application No. 62/982,551, filed on Feb. 27, 2020.

(51) Int. Cl.
*H10N 50/80* (2023.01)
*H10N 50/01* (2023.01)

(52) U.S. Cl.
CPC ............. *H10N 50/80* (2023.02); *H10N 50/01* (2023.02)

(58) Field of Classification Search
CPC ........ H10N 50/80; H10N 50/01; H10N 50/10; H10N 59/00; H10B 61/22; H10B 61/00; H10B 61/10
See application file for complete search history.

(56) References Cited

U.S. PATENT DOCUMENTS

| 10,497,858 | B1* | 12/2019 | Ahn | ................... H10N 50/01 |
| 2016/0268499 | A1* | 9/2016 | You | ................... H10N 50/01 |
| 2016/0380183 | A1 | 12/2016 | Chuang et al. | |
| 2017/0053967 | A1 | 2/2017 | Chuang et al. | |
| 2017/0194557 | A1 | 7/2017 | Chuang et al. | |
| 2019/0088863 | A1* | 3/2019 | Lu | ................... H10N 70/826 |
| 2019/0157099 | A1 | 5/2019 | Chen et al. | |
| 2019/0164584 | A1 | 5/2019 | Chuang et al. | |
| 2019/0165258 | A1 | 5/2019 | Peng et al. | |
| 2019/0165260 | A1 | 5/2019 | Yu et al. | |
| 2020/0006638 | A1* | 1/2020 | Chen | ................... H10B 61/22 |
| 2020/0006641 | A1 | 1/2020 | Liou et al. | |

FOREIGN PATENT DOCUMENTS

| DE | 10 2018 108 545 A1 | 6/2019 |
| DE | 10 2019 116 882 A1 | 1/2020 |
| KR | 20170001558 A | 1/2017 |
| KR | 20190064395 A | 6/2019 |
| KR | 20200001539 A | 1/2020 |

\* cited by examiner

*Primary Examiner* — Jay C Kim
*Assistant Examiner* — Woo K Lee
(74) *Attorney, Agent, or Firm* — Seed IP Law Group LLP

(57) ABSTRACT

The present disclosure relates to a magneto-resistive random access memory (MRAM) cell having an extended upper electrode, and a method of formation the same. In some embodiments, the MRAM cell has a magnetic tunnel junction (MTJ) arranged over a conductive lower electrode. Two protection layers sequentially surround a sidewall of the MTJ. The two protection layers have etch selectivity over one another.

20 Claims, 21 Drawing Sheets

MAGNETIC TUNNEL JUNCTION STRUCTURES WITH PROTECTION OUTER LAYERS

BACKGROUND

Magnetoresistive random-access memory (MRAM) is a promising non-volatile data storage technology. The core of a MRAM storage cell (or "bit") is a magnetic tunnel junction (MTJ) in which a dielectric layer is sandwiched between a magnetic fixed layer (reference layer) and a magnetic free layer (free layer) whose magnetization orientation can be changed. Due to the tunnel magnetoresistance effect, the resistance value between the reference layer and the free layer changes with the magnetization orientation switch in the free layer. Parallel magnetizations (P state) lead to a lower electric resistance, whereas antiparallel magnetizations (AP state) lead to a higher electric resistance. The two states of the resistance values are considered as two logic states "1" or "0" that are stored in the MRAM cell.

In a spin transfer torque MRAM (STT-MRAM) cell, the write current is applied passing through the entire MTJ, i.e., reference layer, the dielectric layer, and the free layer, which sets the magnetization orientation of the free layer through the spin transfer torque effect. That is, the write current passes through a same path as the read path of the MRAM. In a spin-orbit torque MRAM (SOT-MRAM) cell, a MTJ structure is positioned on a heavy metal layer with large spin-orbit interaction. The free layer is in direct contact with the heavy metal layer. Spin torque is induced by the in-plane current injected through the heavy metal layer under the spin-orbit coupling effect, which generally includes one or more of the Rashba effect or the spin Hall effect (SHE effect). The write current does not pass through the vertical MTJ. Instead, the write current passes through the heavy metal layer. The magnetization orientation in the free layer is set through the spin-orbit torque effect. More specifically, when a current is injected in-plane in the heavy metal layer, the spin-orbit coupling leads to an orthogonal spin current which creates a spin torque and induces magnetization reversal in the free layer.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
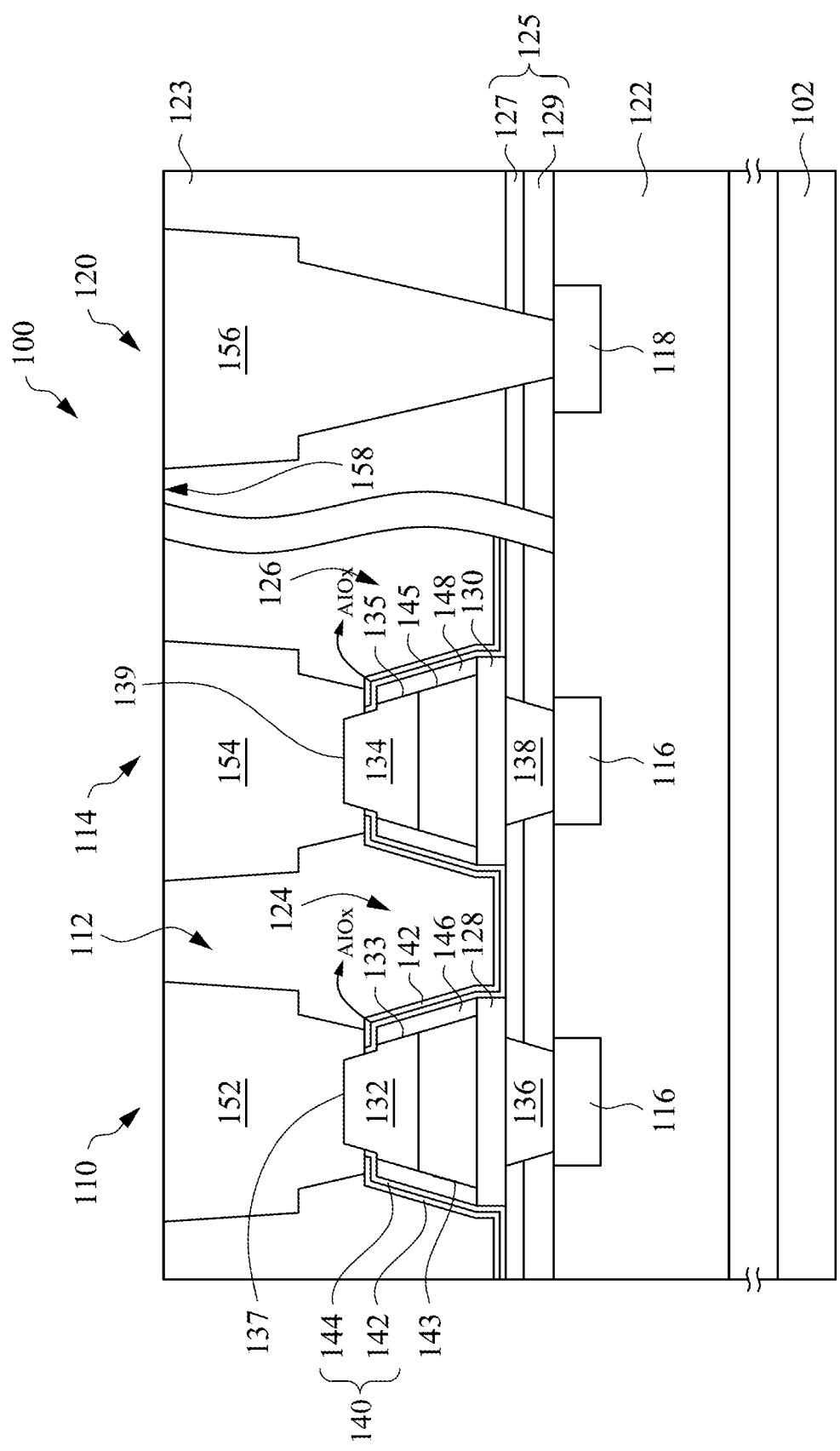
FIG. 1 is an example MRAM structure according to example embodiments of the disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The application is directed to a method of forming interconnect structures to a magnetic tunnel junction (MTJ) structure and a connection feature of a logic device in an integrated process. The MTJ structure is formed over a metallization level to which the connection feature belongs. Therefore, a first interconnect structure to the MTJ structure is shorter than a second interaction structure to the connection feature of the logic device, and is generally wider than the second interaction structure to the connection feature of the logic device. In an integrated hole etching process, e.g., the hole to the MTJ structure and the hole to the connection feature are etched together, the MTJ structure is exposed to a larger dose of etchant.

Two layers of dielectric materials are formed over the MTJ structure. The two layers of dielectric materials prevent the heavy dosage of etchant from damaging the MTJ structure. In some embodiments, the outer/upper layer of the two layers of dielectric materials includes a same dielectric material as an etch stop layer that is positioned between inter-level-dielectric layers, e.g., above the connection feature of the logic device. As such, the same etching process will remove the outer layer of dielectric material in the hole to the MTJ and will remove the etch stop layer in the hole to the connection feature. The inner/lower layer of the two layers of dielectric materials has a high etching selectivity over the outer/upper layer. Therefore, the etching process at least does not totally remove the inner layer of dielectric material. That is, after the etching process which forms holes to the MTJ structure and to the connection feature of the logic device, respectively, the MTJ structure is still covered by the inner layer. The inner layer of dielectric material is sensitive to an acidic solution used for wet cleaning of the hole to the connection feature and the hole to the MTJ structure. The wet cleaning process thus removes the inner/lower layer of the dielectric material exposed in the hole to the MTJ structure and exposes the MTJ structure in the respective hole.

After the wet cleaning, conductive materials are formed in the hole to the MTJ structure and in the hole to the connection feature in a same metal deposition process.

In an integrated circuit (IC), a MTJ structure is formed as part of a back-end-of-line process. The MTJ structure includes a vertical MTJ stack having a free magnetic layer, a fixed magnetic layer and a barrier layer between the free magnetic layer and the fixed magnetic layer. A spacer, e.g., of SiN, laterally envelopes the MTJ stack. A top electrode and a bottom electrode contact the MTJ stack from a top surface or a bottom surface of the MTJ stack, respectively. Two protection layers of dielectric materials are positioned outside the spacer. A bottom electrode via (BEVA) contacts the bottom electrode from below the bottom electrode. A top electrode via TEVA contacts the top electrode from above the top electrode.

In some embodiments, the two protection layers also laterally envelope at least partially the sidewalls of the bottom electrode and the top electrode.

The MTJ stack is positioned in an inter-level dielectric (ILD) layer ILDx vertically positioned over a metallization level in an ILDx-1 layer below the ILDx layer. In some embodiments, the ILDx layer is separated from the ILDx-1 layer by an etch stop layer of, e.g., SiC, and an oxygen rich silicon oxide layer SRO. In the logic region of the IC, the connection features of logic devices are positioned in the ILDx-1 layer. The connection features may include wirings and/or interconnection features, e.g., a connection island and/or a jumper structure.

In some embodiments, an outer one of the two protection layers, outer protection layer, includes a same dielectric material as the etch stop layer, e.g., SiC. The inner one of the two protection layers, inner protection layer, includes a dielectric material that has high selectivity over the outer protection layer and has etch selectivity over a material of the connection feature, which may include one or more of copper, tungsten, cobalt. The inner and outer protection layers do not exist in the logic area.

FIG. 1 shows a portion of an example integrated circuit (IC) 100 over a substrate 102. The IC 100 includes a first portion 110 having a plurality of MRAM cells, MRAM cells 112, 114 shown for illustration. The IC 100 also includes a second portion 120 that have other circuit elements (not shown in FIG. 1) from MRAM cells, e.g., logic circuit elements. FIG. 1 shows the BEOL layers and structures of the IC circuit 100. The MRAM cells 112, 114 are formed in the BEOL process over one or more ILD layers 122, one ILD layer 122 shown for illustration. In some embodiments, metallization features 116, 118 such as metal inter-connection structures or metal wire structures, are formed in the or between the one or more ILD layers 122. For example, the metallization features 116 are in the first portion 110 and below the MRAM cells 112, 114 and the metallization feature 118 is in the second portion 120. For illustrative purposes, the metallization features 116 and the metallization feature 118 are in the same ILD layer 122.

The MRAM cells 112, 114 each includes a MTJ structure 124, 126, respectively. The MTJ structures 124, 126 are each vertically adjacent to a lower electrode (BE) 128, 130, and a top electrode (TE) 132, 134, respectively. Interconnect structures, e.g., connection vias, (BEVA) 136, 138 connect the BE 128, 130, to respective metallization features 116 below, respectively. In some embodiments, the MTJ structures 124, 126 and the respective lower electrode (BE) 128, 130 and top electrode (TE) 132, 134 are formed in an ILD layer 123 that has a same dielectric material as the ILD layer 122 below the MTJ structures 124, 126. The ILD layers 122, 123 are silicon oxide or a low-K dielectric material or other suitable dielectric material. A composite etch stop layer 125 is positioned between the ILD layer 122 and the ILD layer 123. In some embodiment, the composite etch stop layer 125 includes a laminate of two dielectric layers 127, 129 that have etching selectivity over one another. In some embodiments, the lower one 129 of the two layers 127, 129 has an etching selectivity over the ILD layer 123 and functions as an etch stop layer. In some embodiments, the composite etch stop layer 125 includes an etch stop layer 129 of SiC and a silicon rich oxide SRO layer 127 over the SiC layer 129. The layer 127 may also include a TEOS material.

In some embodiments, the BE 128, 130 are formed above the composite etch stop layer 125 and the BEVA 136, 138 are formed in the composite etch stop layer 125. Some embodiments are also possible. For example, the BE 128, 130 may be formed in the composite etch stop layer 125.

A laminate 140 of two protection layers 142, 144 encapsulate sidewalls 143, 145 of the MTJ structures 124, 126. The two protection layers 142, 144 include materials that have etching selectivity over one another. In some embodiments, the outer one 142 of the two protection layers 142, 144 includes a same material as the etch stop layer 129 or a material that is similar in etch selectivity property as the etch stop layer 129. For example, in a case that the etch stop layer 129 is SiC, the outer protection layer 142 is SiC, SiOC, other dielectric materials formed using plasma-enhanced atomic layer deposition "PEALD" process or other suitable materials that has a similar etching property as SiC with respect to an etchant. In some embodiments, the inner protection layer 144 is aluminum oxide ($AlO_x$) or other suitable materials that has an etch selectivity over the outer layer 142.

In some embodiments, the outer protection layer 142 has a thickness ranging between about 50 Å to about 500 Å. The inner protection layer 144 has a thickness ranging between about 2 Å to about 50 Å. The different thickness values of the outer protection layer 142 and the inner protection layer 144 are configured to facilitate forming an aperture in the outer protection layer 142 and the inner protection layer 144 to expose the top electrodes 132, 134. As will be described in detail herein, an aperture will be formed in the inner protection layer 144 using wet etching to expose the top electrode 132, 134. It is generally difficult to etch out aluminum oxide or aluminum nitride in wet etching. As such, the thickness value of the inner protection layer 144 of aluminum oxide or aluminum nitride is configured to be relatively small. In some embodiments, the outer protection layer 142 is SiC or SiOC, same as the layer 129. As described herein, a same etching process opens apertures in the outer protection layer 142 and in the layer 129. In the SiC etching process, the outer protection layer 142 is subject to more loading of etchants than the layer 129 because the outer protection layer 142 is proximal to the etchant source. As such, the thickness value of the outer protection layer 142 is configured to be relatively large.

In some embodiments, spacer layers 146, 148 surround the sidewall 143, 145 of the MTJ structures 124, 126, respectively. The spacer layers 146, 148 are positioned laterally between the sidewall 143, 145 and the laminate 140. In some embodiments, the spacer layers 146, 148 are positioned over the BE 128, 130, respectively. The spacer layers 146, 148 are SiN or other suitable dielectric material.

In some embodiments, the laminate 140 also encapsulate at least partially the sidewall 133, 135 of the top electrodes 132, 134. Upper portions of the top electrodes 132, 134, e.g., including upper surfaces 137, 139 of the top electrodes 132, 134 and, in some embodiments, upper portions of the sidewalls 133, 135, are exposed from the laminate 140. Metal interconnection structures 152, 154 are formed over the top electrodes 132, 134 and contact the upper portions of the top electrodes 132, 134 that are exposed from the laminate 140. In some embodiments, the laminate 140 extends over the whole surface of the first region 110, except for the upper portions of the top electrodes 132, 134 that are exposed from the laminate 140. The laminate does not extend over the second region 120.

In some embodiments, a metal interconnection structure 156 is formed in the second region 120, and contacts the metallization feature 118. Specifically, the metal interconnection structure 156 extends through the ILD 123 and the composite etch stop layer 125, and contacts the metallization feature 118. The metal interconnection structures 152, 154, 156 are formed in a same process and all extend downwardly from an upper surface 158 of the ILD 123. The metal interconnection structures 152, 154, 156 are coplanar to one another with respect to the upper surface 158 of the ILD 123.

In an embodiment, the BE 128, 130 includes a conductive nitride that has a magnetic property suitable for the operation of the respective MTJ structures 124, 126. For example, the conductive nitride material of the BE 128, 130 does not affect pinning the magnetic polarization of a fix layer of the MTJ structures 124, 126. In an embodiment, the BE 128, 130 are one or more of TaN or TiN. The BEVA 136 includes a material that matches the electrical and magnetic properties of the BE 128, 130. In an embodiment, the BEVA 136 is TiN. In some embodiments, the BEVA 136 also includes a barrier or liner layer (not shown for simplicity) of one or more of Ta or TaN that prevent the TiN material from permeating into the surrounding SiC layer 129 and the SRO/TEOS layer 127.

Figure 2:
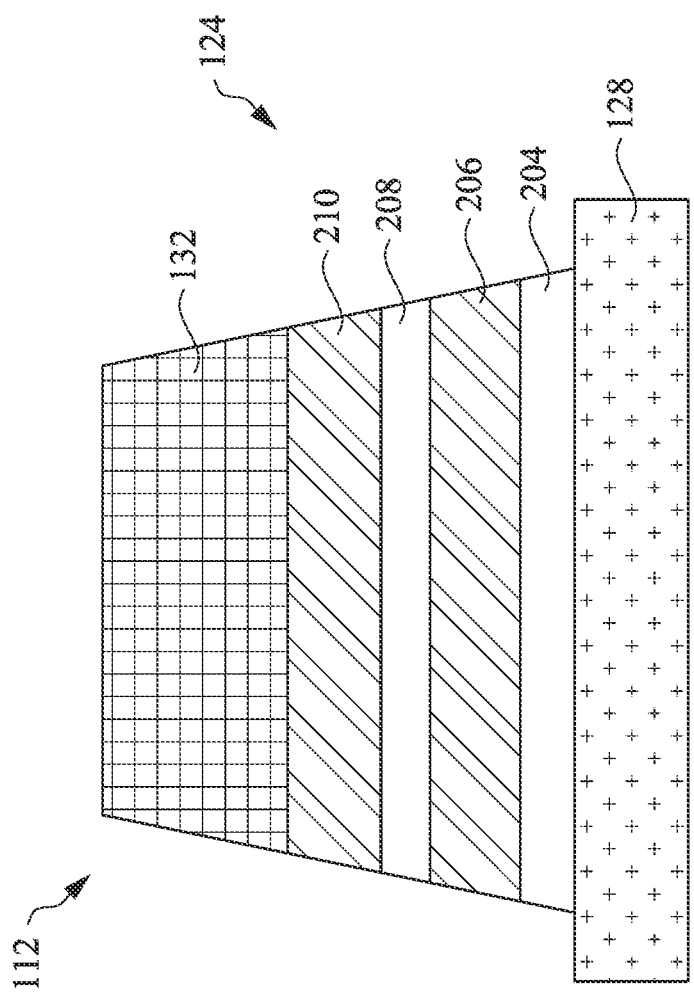
FIG. 2 is an example MRAM cell according to example embodiments of the disclosure.

FIG. 2 shows an example MRAM cell 112. Referring to FIG. 2, the MRAM cell 112 includes a BE 128. An anti-ferromagnetic layer 204 is arranged over the conductive lower electrode 128, and a pinned magnetic layer 206 is arranged over the anti-ferromagnetic layer 204. The anti-ferromagnetic layer 204 includes a material with strong exchange coupling, which has atoms with magnetic moments aligned in a regular pattern with neighboring spins pointing in opposite directions. The strong exchange coupling allows for the anti-ferromagnetic layer 204 to pin (i.e., fix) the magnetic polarization of the pinned magnetic layer 206, thereby preventing the magnetic polarization of the pinned magnetic layer 206 from switching, e.g., during write operations of the MRAM cell 112. To this extent, the pinned magnetic layer 206 is also referred to as a fix layer 206 of the MTJ structure 124. In some embodiments, a synthetic anti-ferromagnetic (SAF) layer (not shown for simplicity) may be disposed between the anti-ferromagnetic layer 204 and the pinned magnetic layer 206.

In the MTJ structure 124, the pinned magnetic layer 206 is vertically separated from a free magnetic layer 210 by a dielectric barrier layer 208. The free magnetic layer 210 or free layer 210 includes a magnetic polarization that is capable of switching between a parallel configuration and an anti-parallel configuration with respect to that of the pinned magnetic layer 206. The upper/top electrode 132 is disposed over the free magnetic layer 210. Optionally, a dielectric cap or spacer layer 146 of, e.g., silicon nitride (SiN), is arranged around the MTJ structure 124. The spacer layer 146 may also be carbide (SiC), silicon dioxide ($SiO_2$), silicon oxy-nitride (SiON), silicon oxy-carbide (SiOC), and/or a low-k dielectric material.

The pinned magnetic layer 206, the dielectric barrier layer 208, and the free magnetic layer 210 form the magnetic tunnel junction (MTJ) 124. Within the MTJ 124, electrons may tunnel through the dielectric barrier layer 208 upon application of a differential voltage between the conductive lower electrode 128 and the conductive upper electrode 132. As the electrons tunnel through the dielectric barrier layer 208, the magnetic polarization of the free magnetic layer 210 may change, thereby changing a resistance value of the MTJ 124. For example, if a polarity of the free magnetic layer 210 is aligned with a polarity of the pinned magnetic layer 206, the MTJ 124 has a first resistance value corresponding to a first data state, e.g., a logical "0". If the polarity of the free magnetic layer 210 is misaligned with the polarity, of the pinned magnetic layer 206, the MTJ 124 has a second resistance value corresponding to a second data state, e.g., a logical "1".

In some embodiments, the conductive lower or bottom electrode BE 128 may include titanium nitride (TiN), tantalum nitride (TaN), titanium (Ti), and/or tantalum (Ta). In some embodiments, the BE 128 may have a thickness in a range of between approximately 10 nm and approximately 100 nm. In some embodiments, the anti-ferromagnetic layer 204 may include iridium manganese (IrMn), iron manganese (FeMn), ruthenium manganese (RuMn), nickel manganese (NiMn), and/or palladium platinum manganese (PdPtMn). In some embodiments, the pinned magnetic layer 206 may comprise cobalt (Co), iron (Fe), boron (B), and/or ruthenium (Ru). In some embodiments, the pinned magnetic layer 206 may have a thickness in a range of between approximately 5 nm and approximately 10 nm.

In some embodiments, the dielectric barrier layer 208 may include magnesium oxide (MgO) and/or aluminum oxide ($Al_2O_3$) and may have a thickness in a range of between approximately 0.5 nm and approximately 2 nm. In some embodiments, the free magnetic layer 210 may include one or more of cobalt (Co), iron (Fe), and boron (B) and may have a thickness in a range of between approximately 1 nm and approximately 3 nm.

In some embodiment, the conductive upper electrode 132 may comprise titanium nitride (TiN), tantalum nitride (TaN), titanium (Ti), tungsten (W), and/or tantalum (Ta).

In some embodiments, cross-sections of the conductive upper electrode 132, the free magnetic layer 210, the dielectric barrier layer 208, the pinned magnetic layer 206, the anti-ferromagnetic layer 204, and the conductive upper electrode 132 are substantially acute trapezoid, either individually or together as a group. Widths of the conductive lower electrode 128, the free magnetic layer 210, the dielectric barrier layer 208, the pinned magnetic layer 206, and the anti-ferromagnetic layer 204 keep increasing along the downward direction, in z-axis. In some embodiments, this acute trapezoid cross-sectional shape is formed by an ion beam etching (IBE) process used to form sidewalls 143 of the MTJ structure 124 and the sidewall 133 of the upper electrode 132. In other words, the free magnetic layer 210, the dielectric barrier layer 208, the pinned magnetic layer 206, the anti-ferromagnetic layer 204, and the top electrode 132 have substantially aligned and sloped sidewalls.

Figure 3A:
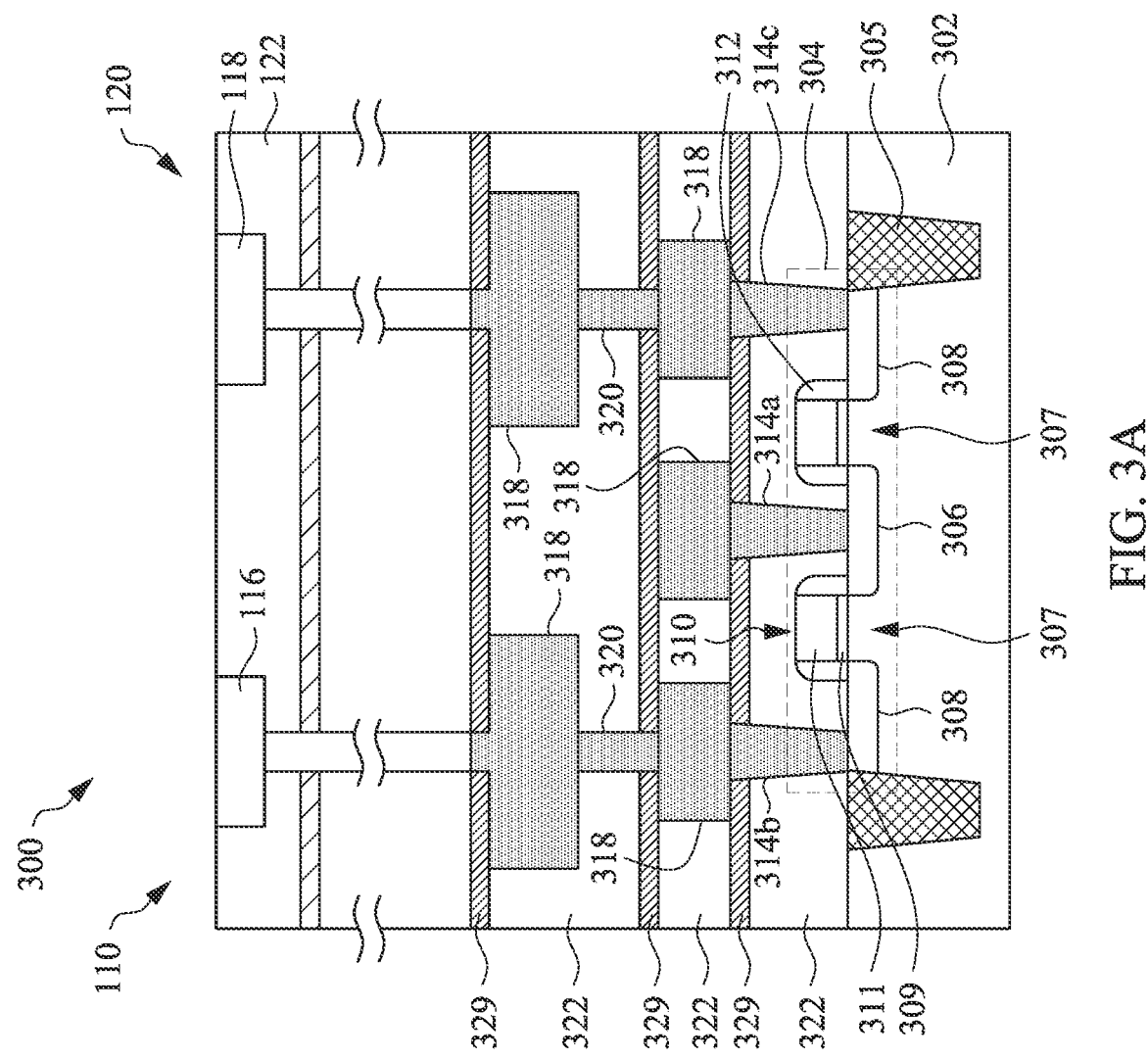
FIGS. 3A to 3D show a wafer in various stages of a first fabrication process according to example embodiments of the disclosure.

FIGS. 3A to 3D illustrate a wafer 300 in various fabrication stages of forming the IC 100, the MRAM cell 112, or other semiconductor structures. Referring to FIG. 3A, a wafer 300 is received. The wafer 300 includes a semiconductor body 302. The semiconductor body 302 may be a silicon substrate in crystalline structure and/or other elementary semiconductors like germanium. Alternatively or additionally, the semiconductor body 302 may include a compound semiconductor such as silicon carbide, gallium arsenide, indium arsenide, and/or indium phosphide. Further, the semiconductor body 302 may also include a silicon-on-insulator (SOI) structure. The semiconductor body 302 may include an epitaxial layer and/or may be strained for performance enhancement. The semiconductor body 302 may also include various doping configurations depending on design requirements as is known in the art such as p-type substrate and/or n-type substrate and various doped regions such as p-wells and/or n-wells. One or more selection transistors 304 are arranged within or over the semiconductor body 302. In some embodiments, the one or more selection transistors 304 are disposed between isolation regions 305 (e.g., STI regions).

In some embodiments, the one or more selection transistors 304 may comprise MOSFET (metal-oxide-silicon field effect transistor) devices. The transistors 304 may be various types such as a planar transistor, a finFET transistor, a gate-all-around transistor, a vertical transistor or other types of transistors, none of which limit the scope of the disclosure. In such embodiments, the one or more selection transistors 304 respectively comprise a source region 306 and a drain region 308, separated by a channel region 307. The source region 306 comprises a first doping type (e.g., an n-type dopant), the channel region 307 comprises a second doping type different than the first doping type, and the drain region 308 comprises the first doping type. In some embodiments, the first doping type comprises an n-type doping, while in other embodiments the first doping type comprises a p-type doping. A gate structure 310, comprising a gate electrode 311 separated from the channel region 307 by a gate oxide layer 309, is configured to control the flow of charge carriers between the source region 306 and the drain region 308. In various embodiments, the gate structure 310 may comprise a doped polysilicon material or a metal material (e.g., TiN, Al, etc.). In some embodiments, sidewalls spacers 312 (e.g., SiN spacers) may be disposed on opposing sides of the gate electrode 311.

Back-end-of-the-line (BEOL) metal features 318, 320, or metallization features, are disposed over the semiconductor body 302, some contacting the terminals of the transistors 304 through contact vias 314 (314a, 314b, 314c shown). The metallization features 318, 320 stack vertically, some of which ultimately lead to metallization features 116 in the first region 110 and metallization features 118 in the second region 120. The metallization features are formed in ILD layers 322 including ILD layer 122 where the metallization features 116 and 118 are formed. In some embodiments, the inter-level dielectric (ILD) layers 322, 122 are separated from one another by an etch stop layer 329 of, e.g., SiC or SiN.

Figure 3B:
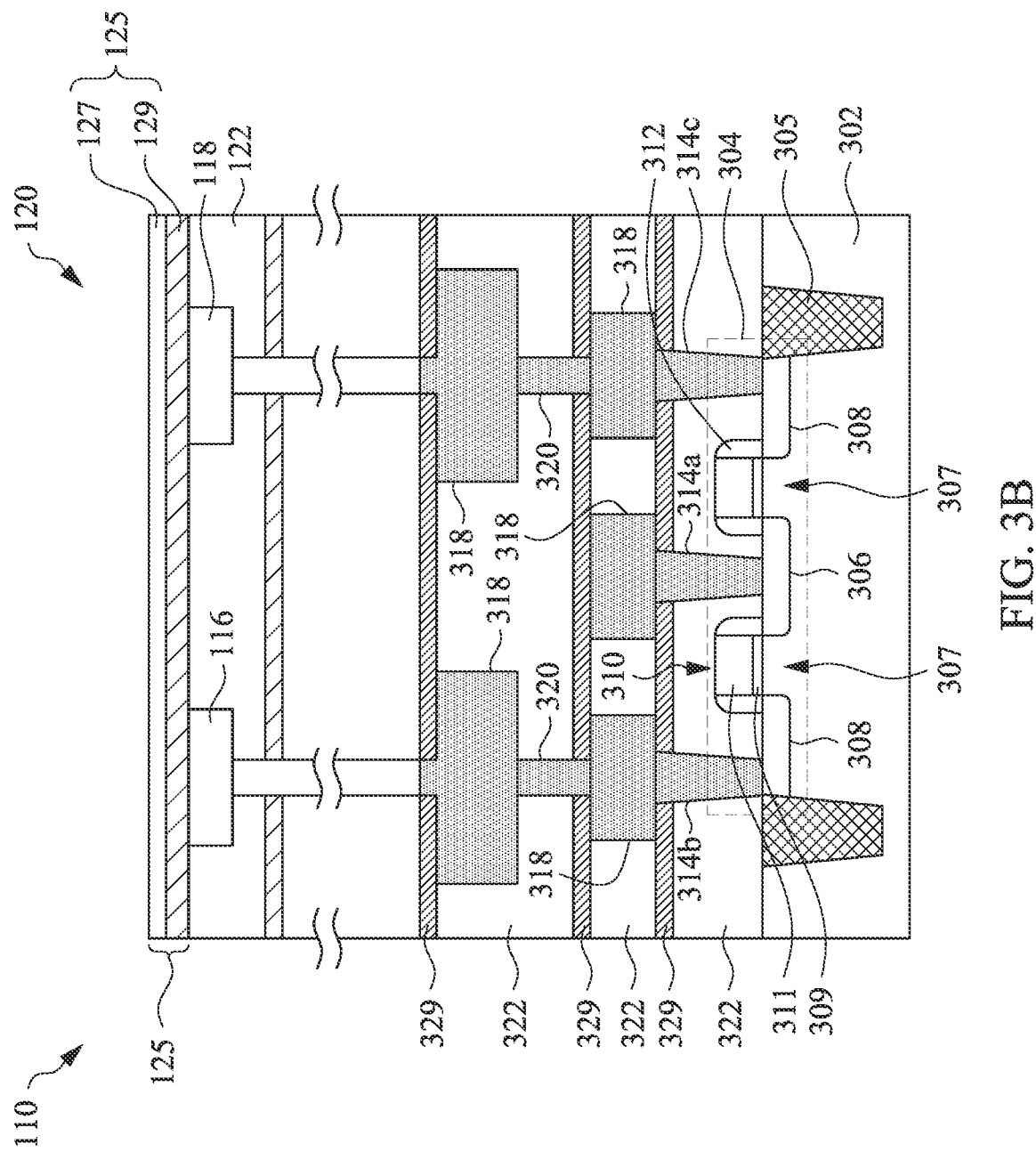

In FIG. 3B, a composite etch stop layer 125, including a layer 127 of SRO or TEOS and a layer 129 of SiC, is formed over the ILD layer 122. The composite etch stop layer made of a tetraethoxysilane (TEOS) oxide layer overlying the conventional silicon-based SiC etch stop layer can further reduce the overall thickness and the dielectric constant for the composite etch stop layer 125.

Figure 3C:
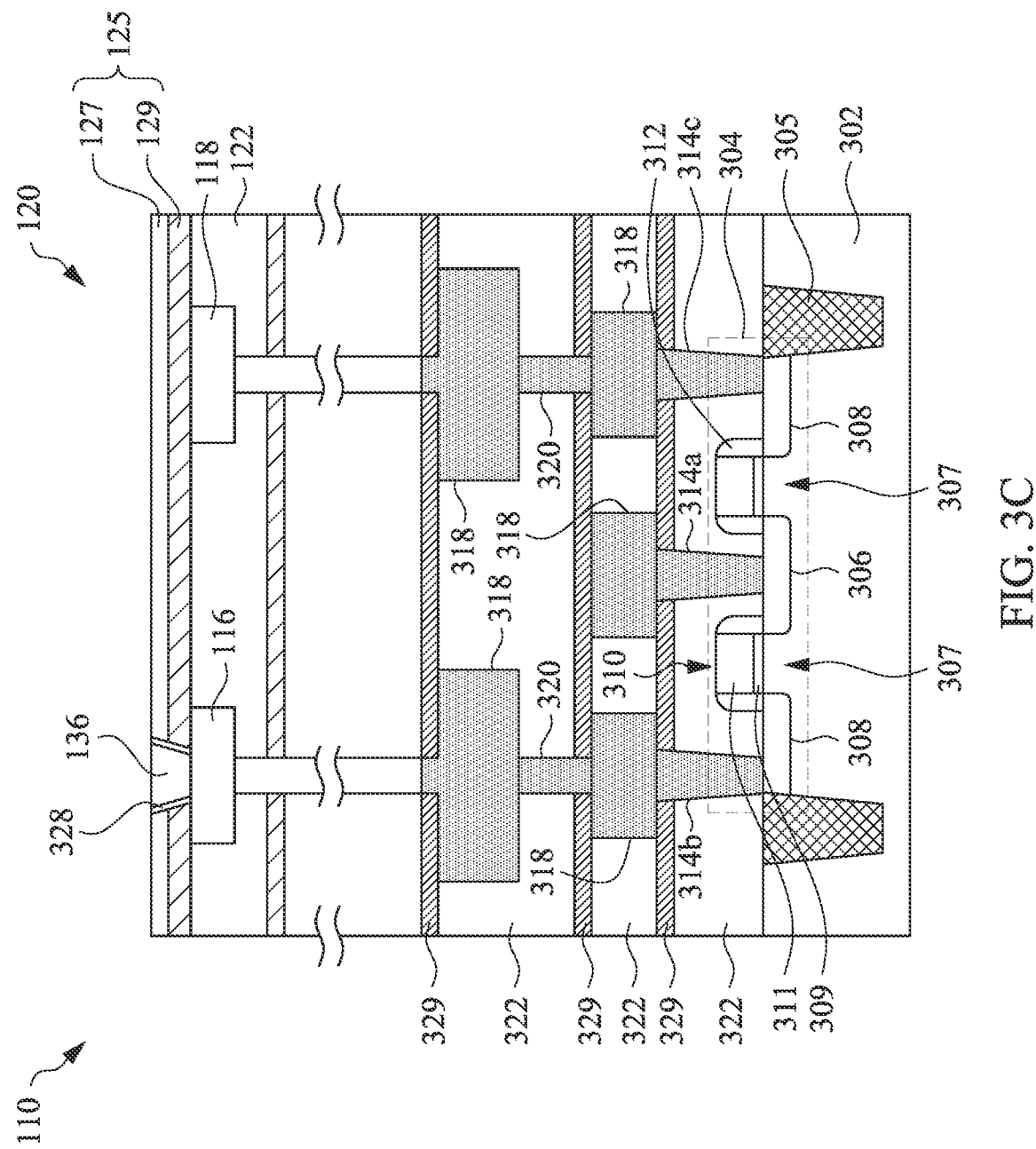

In FIG. 3C, a BEVA structure 136 is formed in the composite etch stop layer 125 in the first region 110, contacting the metallization feature 116 in the ILD layer 122. The BEVA via structure 136 includes a different material from that of the metallization feature 116. In some embodiments, the BEVA via structure 136 is TiN, and the metallization feature 116 is copper. The layer 127 is a material that is suitable for the deposition of the BEVA via structure 136 of, e.g., TiN. In some embodiments, the layer 127 is one or more of SRO or TEOS or other suitable dielectric materials. In some embodiments, a barrier or liner layer 328 is formed between the BEVA via structure 136 and the surrounding composite etch stop layer 125. The barrier layer 328 is one or more of Ta or TaN. The barrier layer 328 prevents the TiN elements from permeating into the surrounding composite etch stop layer 125. In some embodiments, the BEVA via structure 136 is formed only in the layer 127 and is not formed in the layer 129 of SiC. That is, another interconnection structure is formed in the layer 129 between the BEVA via structure 136 and the metallization feature.

Figure 3D:
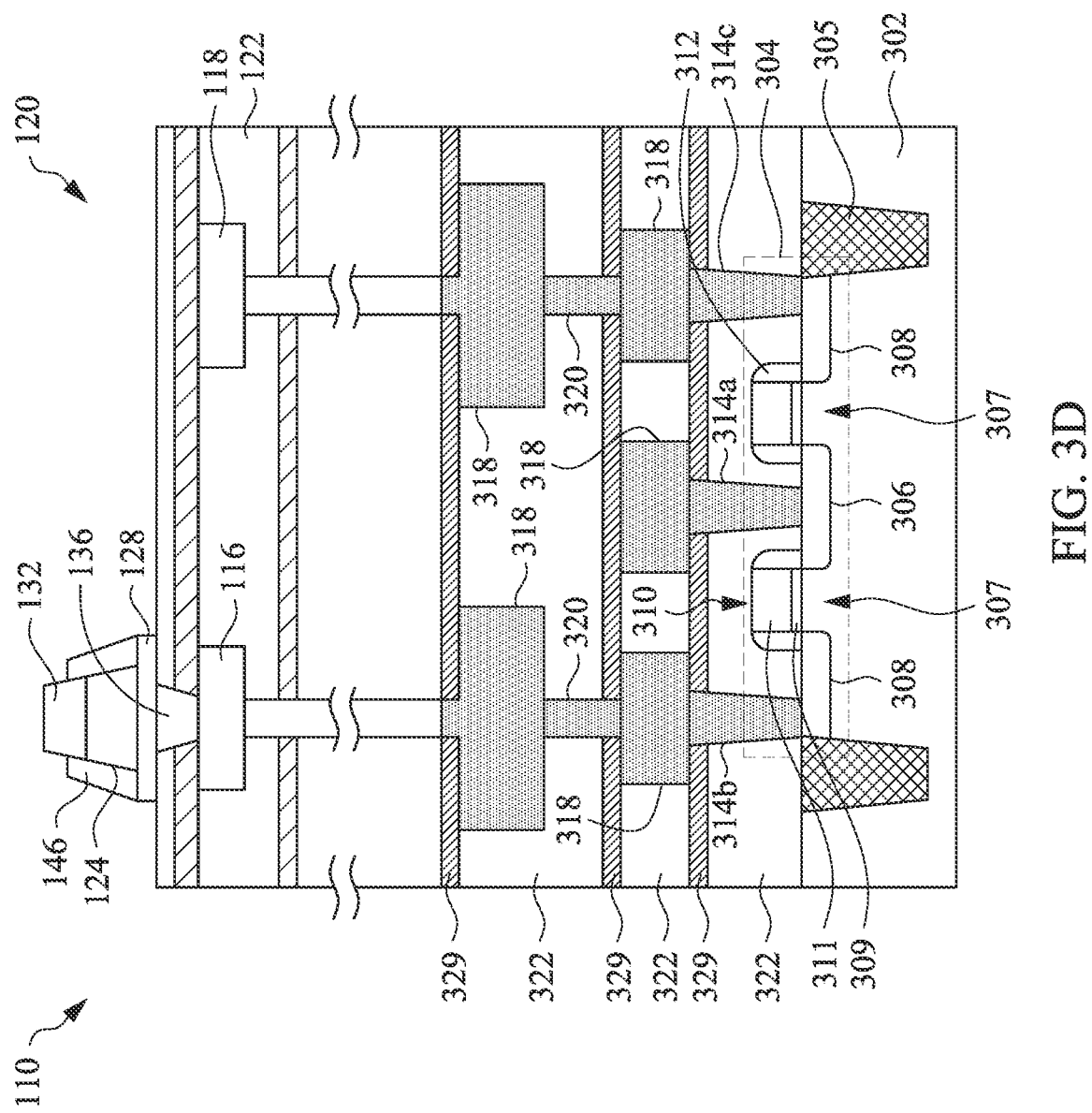

In FIG. 3D, a MRAM cell 112 is formed in the first region 110 over the BEVA via structure 136 and the composite etch stop layer 125. The MRAM cell includes a MTJ structure 124, a top electrode 132, and a bottom electrode 128. In some embodiments, a spacer layer 146 surrounds at least the MTJ structure 124 of the MRAM cell 112.

FIGS. 4A to 4K illustrate further formation of the MRAM cell 112 and the metallization feature over the MRAM cell 112.

Figure 4A:
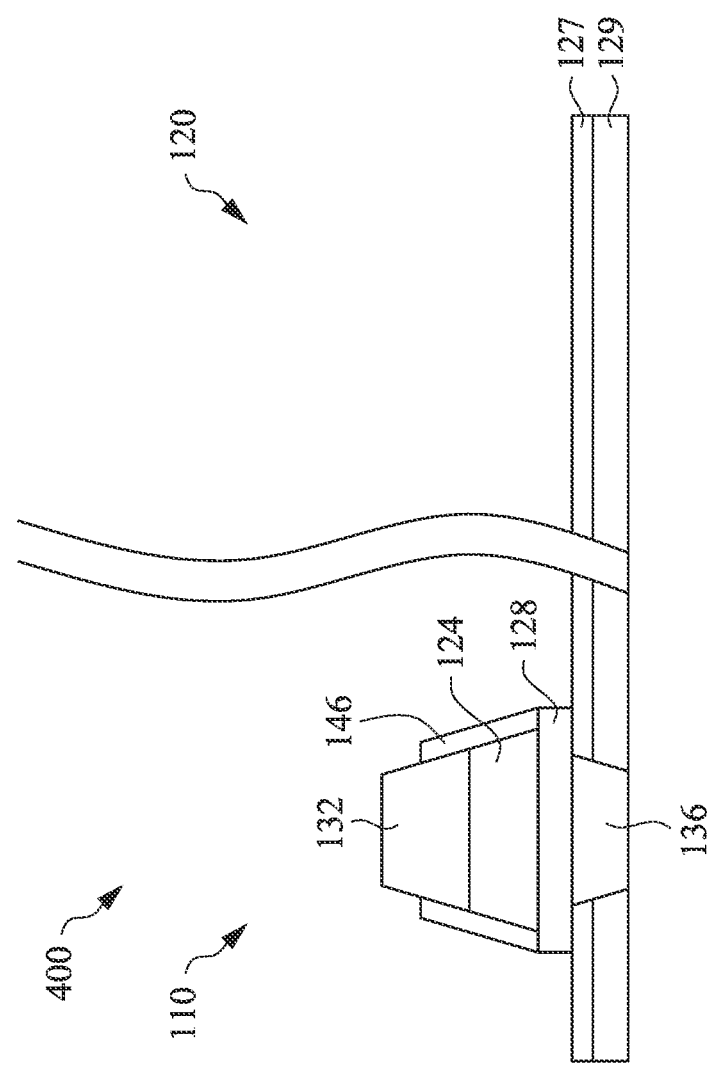
FIGS. 4A to 4K show a wafer in various stages of a second fabrication process according to example embodiments of the disclosure.

In FIG. 4A, an example wafer 400 is received. The example wafer 400 may be a same wafer as the wafer 300 after the processes of FIGS. 3A to 3D. The example wafer 400 is shown to have a first area 110 for MRAM cells and a second area 120 for other circuitry elements, e.g., logic elements.

Figure 4B:
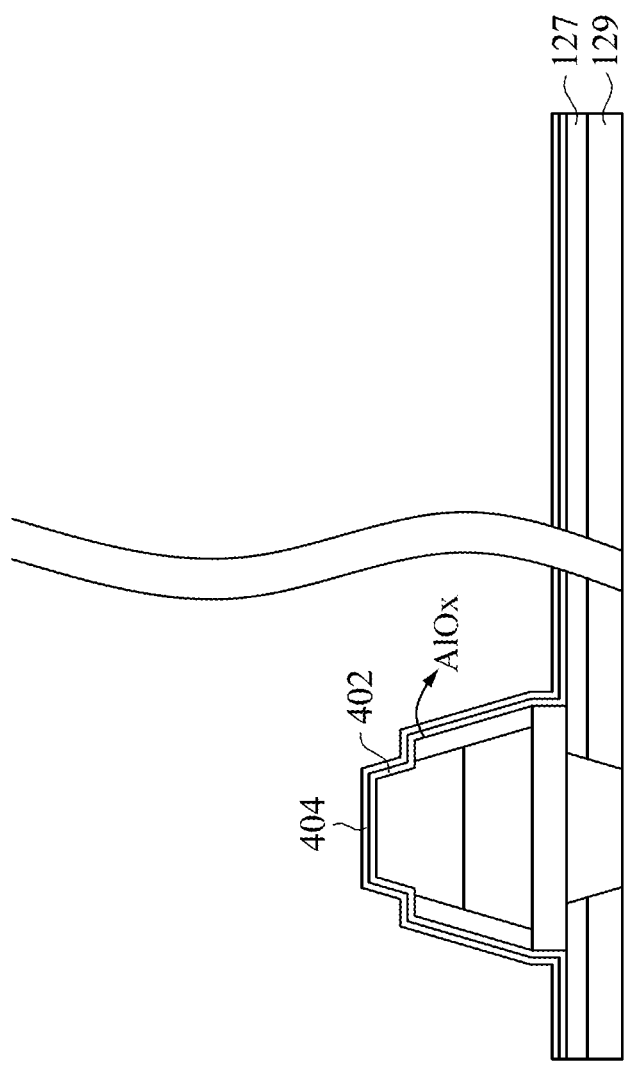

In FIG. 4B, a laminate of two layers 402, 404 is globally formed over the wafer 400. The two layers 402, 404 have high etch selectivity over one another. In some embodiments, the layer 402 is a same material as the etch stop layer 129 or a material that has similar etching characteristics as the etch stop layer 129. In a case that the etch stop layer 129 is SiC, the layer 402 is SiC, SiOC or other dielectric materials formed using PEALD. The layer 404 is aluminum oxide ($AlO_x$) or aluminum nitride (AiN) or a material that has similar etching characteristics. The layer 404 is deposited with a thickness ranging from about 50 Å to about 500 Å. The layer 402 is deposited with a thickness ranging from about 2 Å to about 50 Å.

Figure 4C:
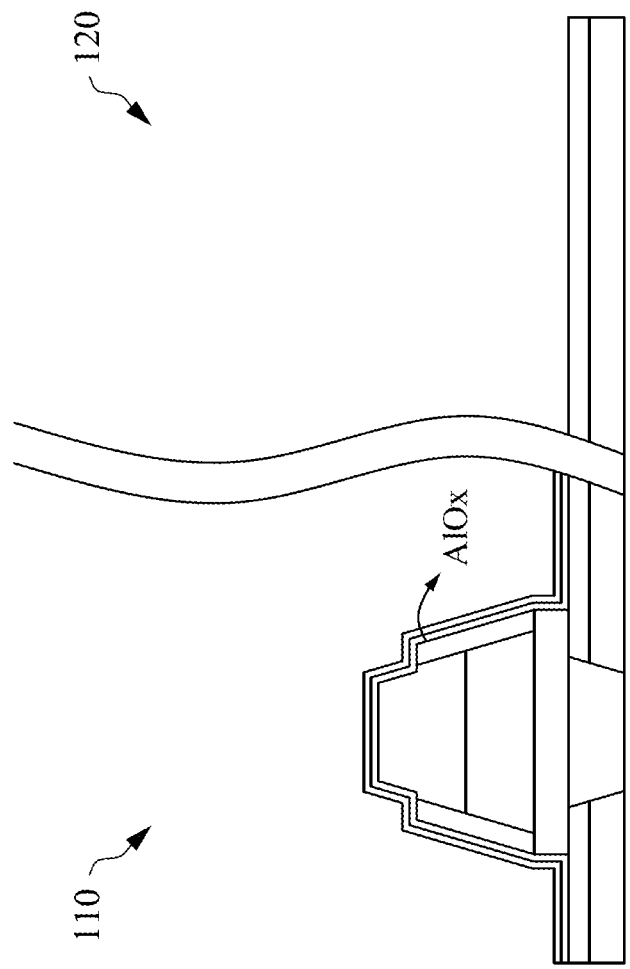

In FIG. 4C, the layers 402 and 404 are selectively removed from the second region 120 by etching, e.g., with the first region 110 being covered by a mask layer (not shown for simplicity). A portion of the layer 127 of SRO or TEOS may also be removed by the etching such that the thickness of the layer 127 in the second region 120 is less than the thickness of the layer 127 in the first region 110. Due to the etching selectivity between the layer 404 of aluminum oxide ($AlO_x$) or aluminum nitride (AiN) and the etch stop layer 129 of SiC, the etch stop layer 129 remains after the layers 402 and 404 have been removed from the second region 120.

Figure 4D:
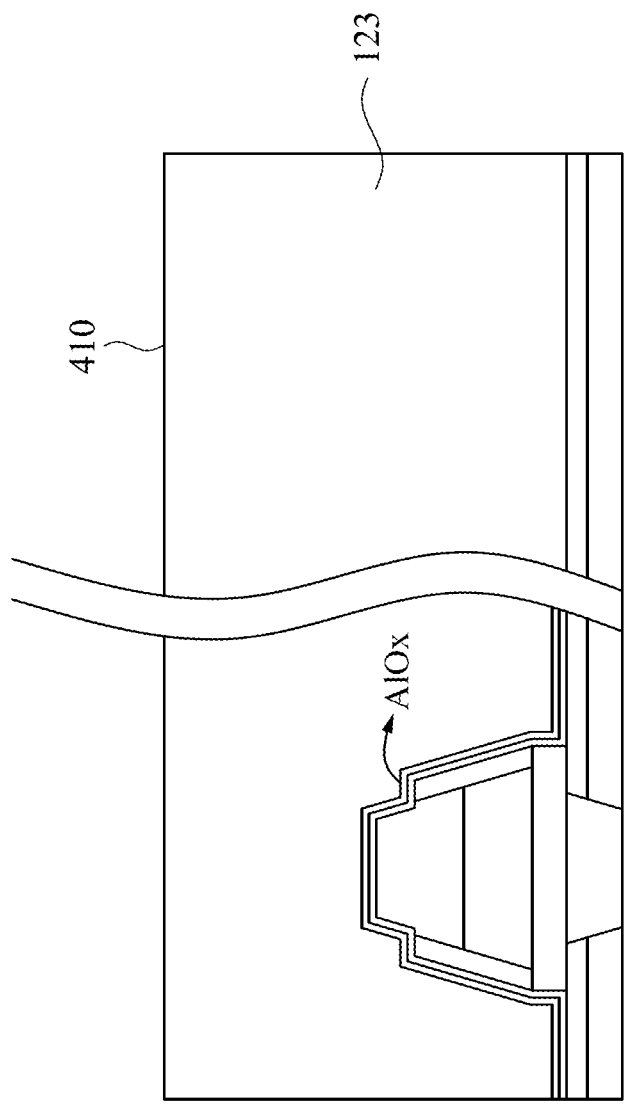

In FIG. 4D, an ILD layer 123 is globally or blanketly formed over the wafer 400. Specifically, the ILD layer 123 is formed over both the first region 110 and the second region 120. In some embodiments, the ILD layer 123 is an extremely low-k (ELK) material, such as SiCOH, porous SiCOH, NanoGlass or other dielectric materials that has a dielectric constant k≤ 3. A buffing CMP process is conducted to planarize the surface 410 of ILD layer 123.

Figure 5A:
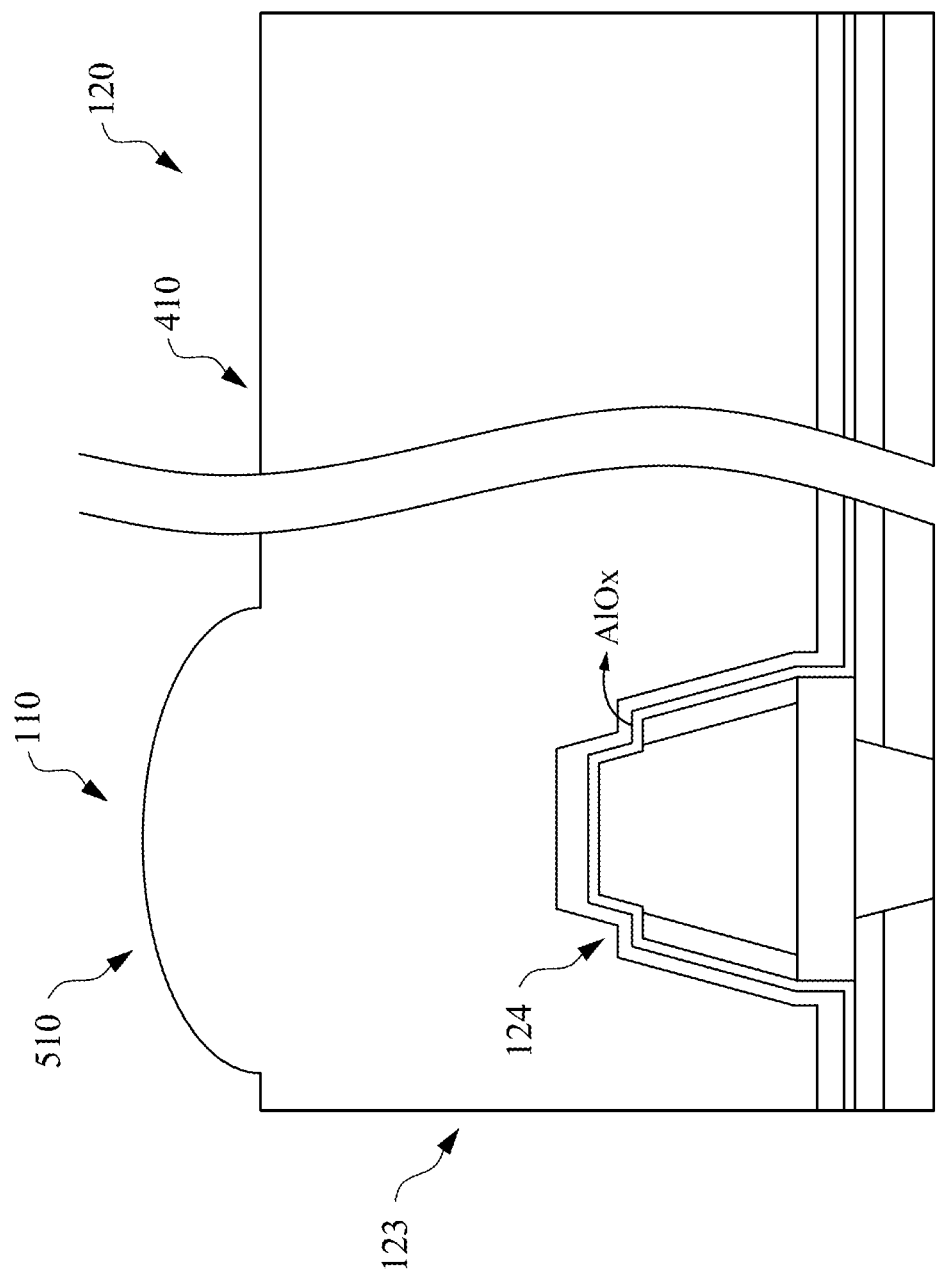
FIGS. 5A-5D show a wafer in various stage of a third fabrication process according to example embodiments of the disclosure.
Figure 5B:
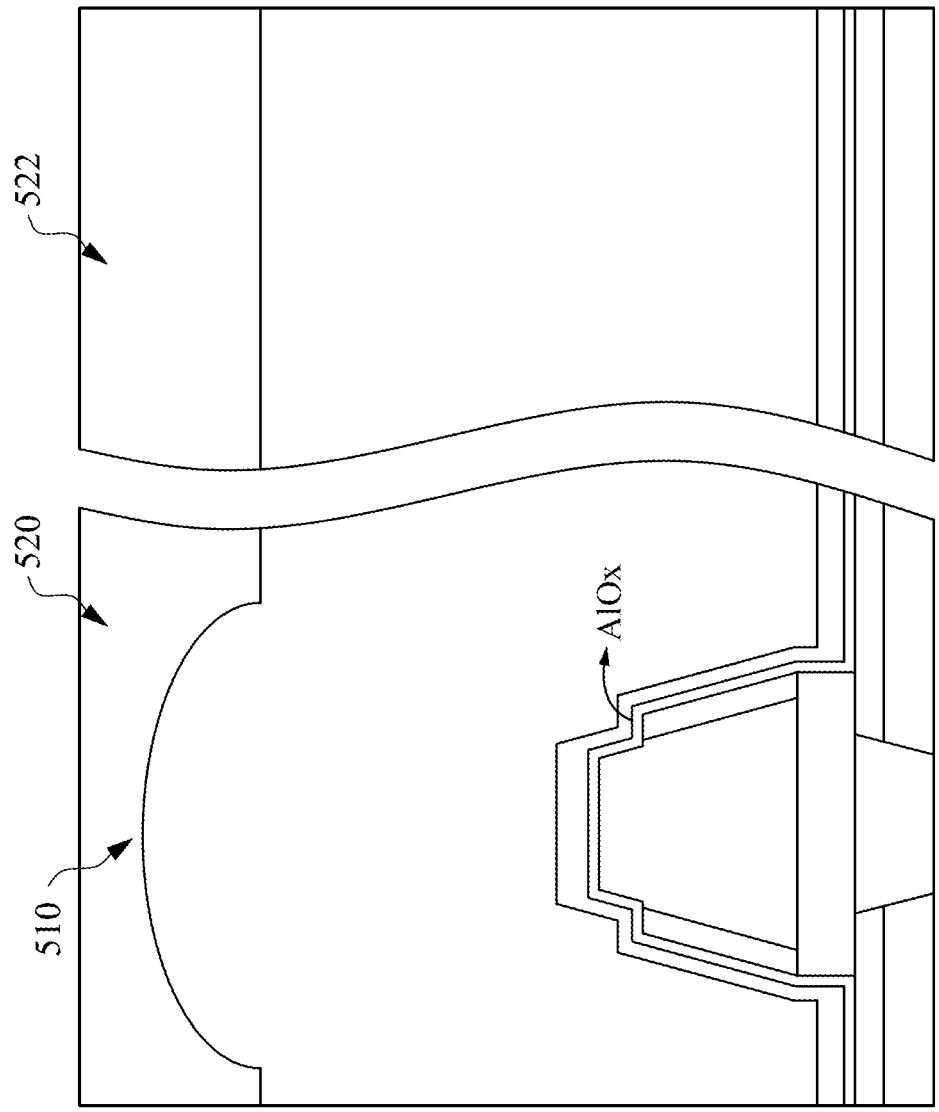
Figure 5C:
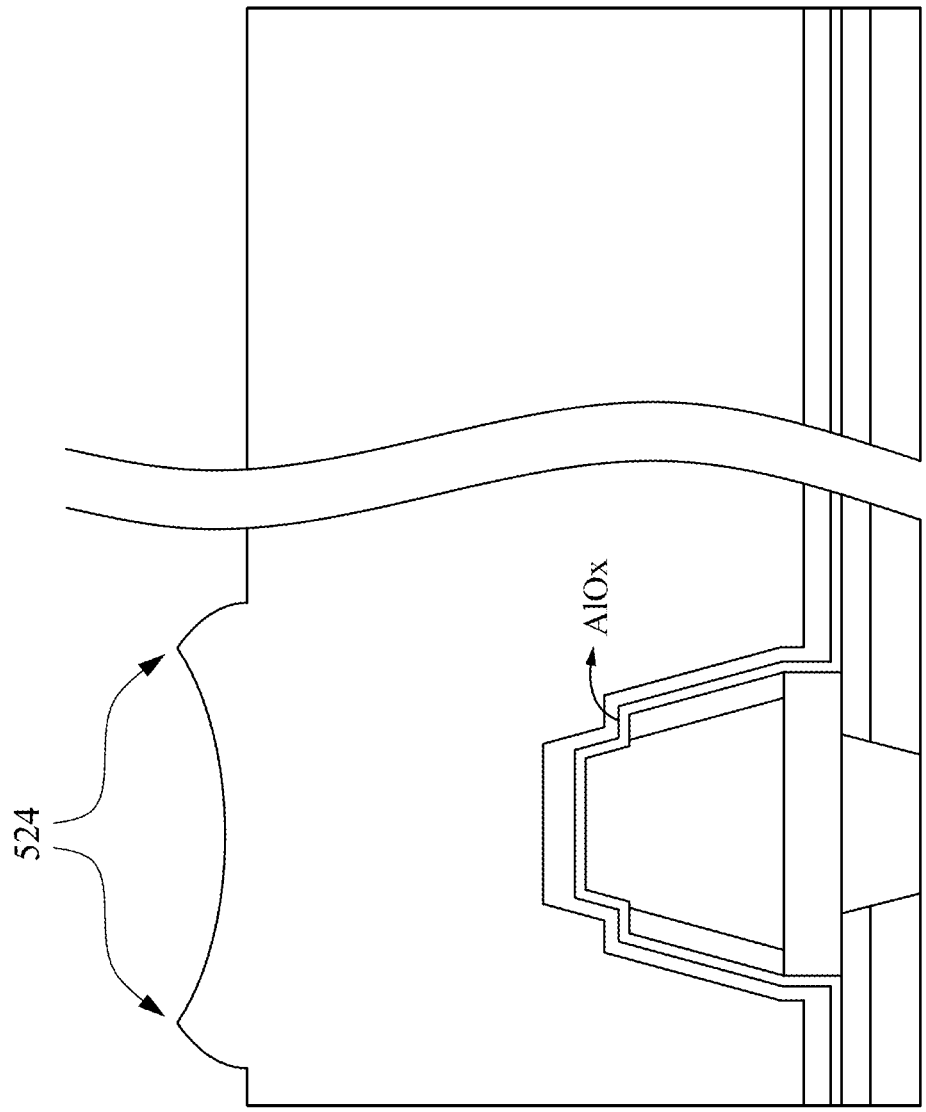
Figure 5D:
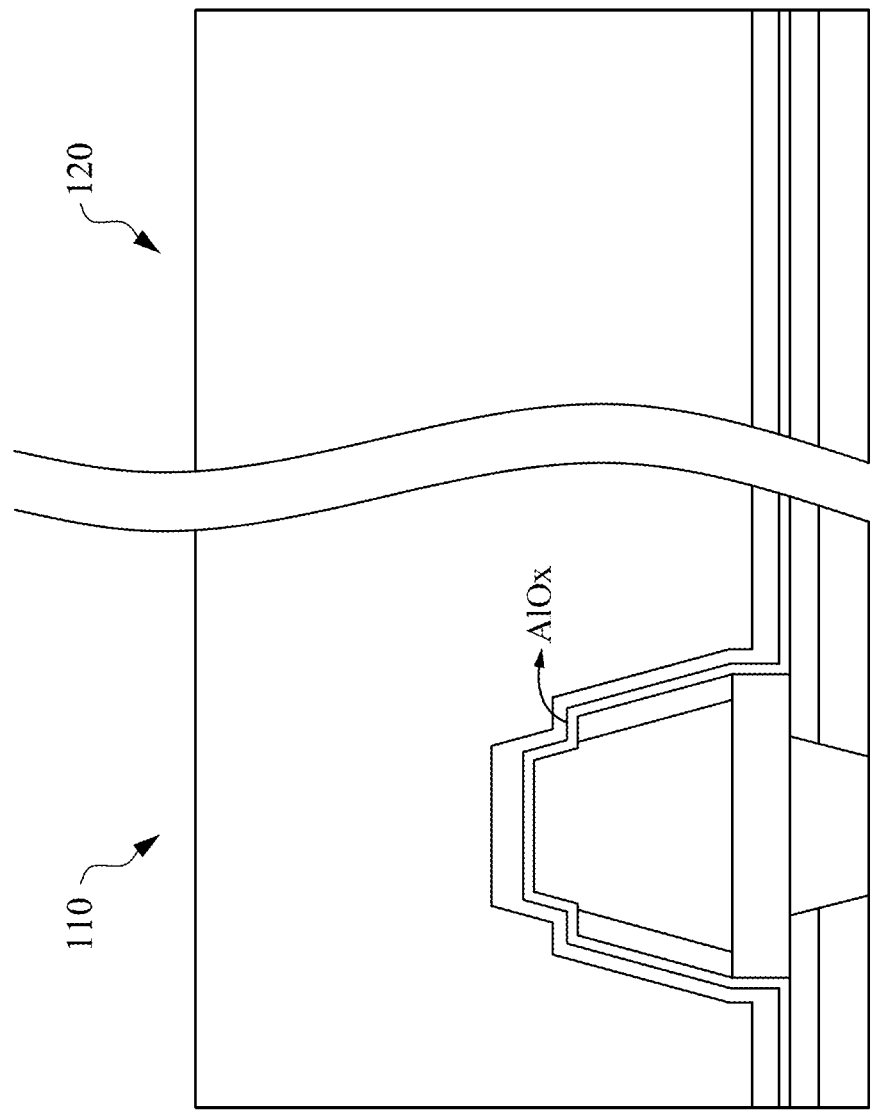

FIGS. 5A-5D show an example process of planarizing the surface 410 of ILD 123. In FIG. 5A, the ILD layer 123 is globally formed over the first region 110 and the second region 120. Because of the MTJ structure 124, the ILD layer 123 includes a bump or a step height 510 over the MTJ structure 124. In FIG. 5B, a coating layer 520 of a low-K dielectric material is coated over the ILD layer 123. The coating layer 520 covers the bump 510 and has a relatively flat surface 522. In FIG. 5C, an etch-back process is conducted to remove the coating layer 520 and the bump 510. In some embodiments, residual portions 524 of the bump 510 remain after the etch-back process. In FIG. 5D, a buffing CMP process is conducted to remove the residual portions 524 and to planarize the surface 410 of ILD layer 123.

Figure 4E:
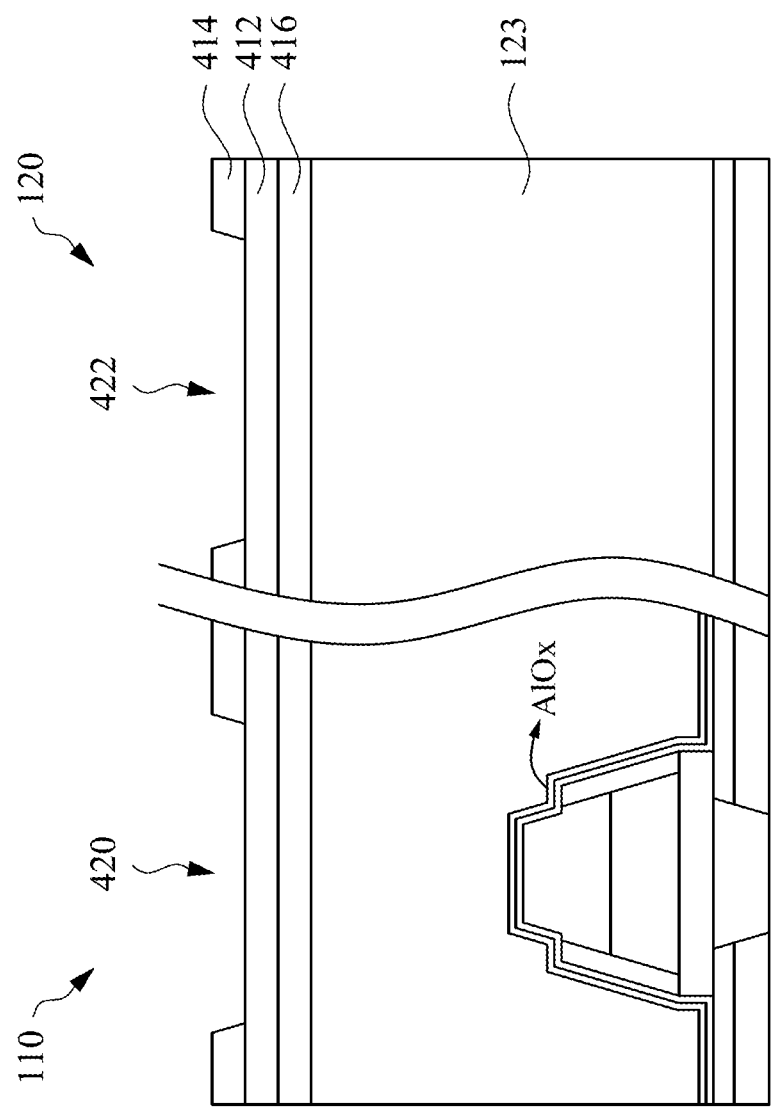

In FIG. 4E, an anti-reflection layer 412 and a hard mask layer 414 are successively formed over the ILD layer 123. In some embodiments, the anti-reflection layer 412 is a layer of nitrogen-free anti-reflective coating (NFARC), and the hard mask layer 414 is a TiN/TaN layer. Both the layers 412 and 414 function as the sacrificial layers. The hard mask layer 414 is patterned to have apertures 420 in the first region 110 and apertures 422 in the second region 120. The apertures 420, 422 define the locations to form metallization features to be formed in the ILD layer 123 in the first regions 110 and the second regions 120. In some embodiments, the apertures 420, 422 in the first region 110, and the second region 120, respectively, may have a same dimension, e.g., a same surface area. In some embodiments, a sacrificial dielectric hard mask layer 416 is formed between the ILD layer 123 and the NFARC layer 412. The layer 416 functions to prevent the kink defect at the surface of the low-k dielectric ILD layer 123. For example, the sacrificial dielectric hard mask layer 416 is formed of silicon containing dielectric materials such as silicon nitride employing methods such as plasma enhanced chemical vapor deposition (PECVD), high density plasma chemical vapor deposition (HDP-CVD) and atmospheric pressure chemical vapor deposition (APCVD).

Figure 4F:
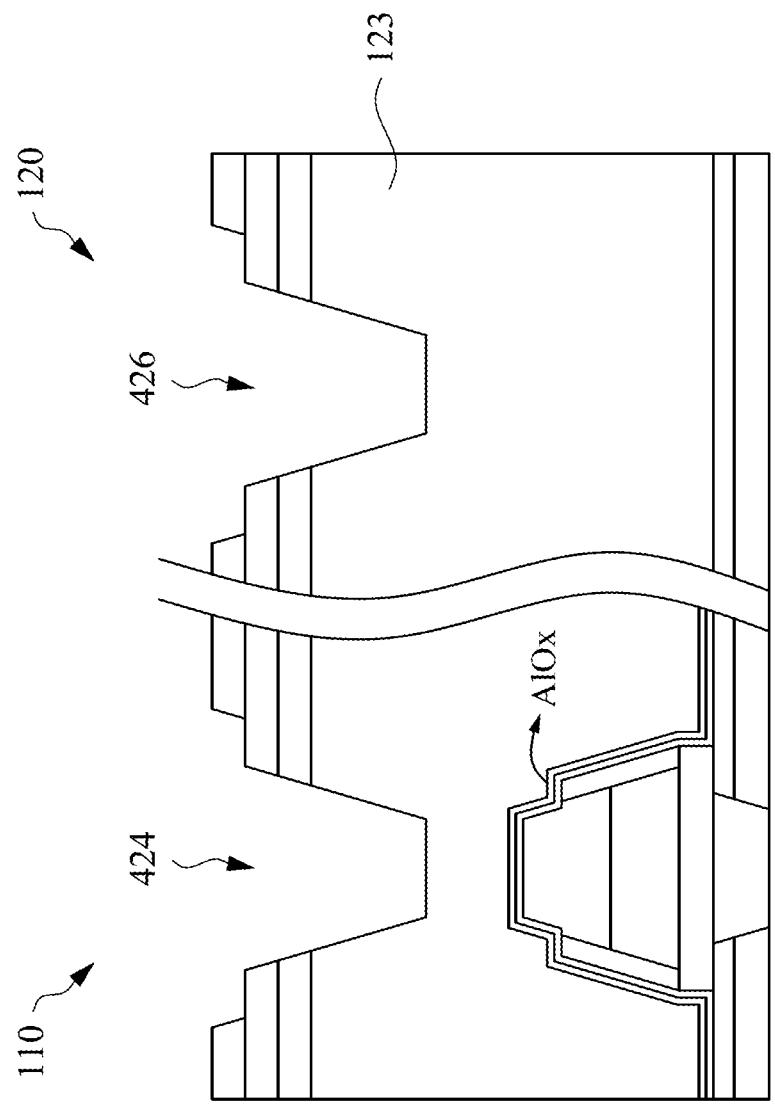

In FIG. 4F, a partial via etch process is implemented to form partial via holes or trenches 424, 426 through the apertures 420, 422. Specifically, the partial via etch opens the NFARC layer 412 to partially remove the material of the ILD layer 123 situated on where is designated to form the via hole or trench leading to the MRAM cell 112 in the first region 110 or to the metallization features 118 in the second region 120. The apertures 420, 422 are formed together in an integrated etch process. That is, none of the first region 110 or the second region 120 is covered when the partial via etch process is conducted on the other one of the first region 110 or the second region 120. In some embodiments, the partial via holes or trenches 424, 426 have substantially same dimensions, e.g., in depth and shape.

Figure 4G:
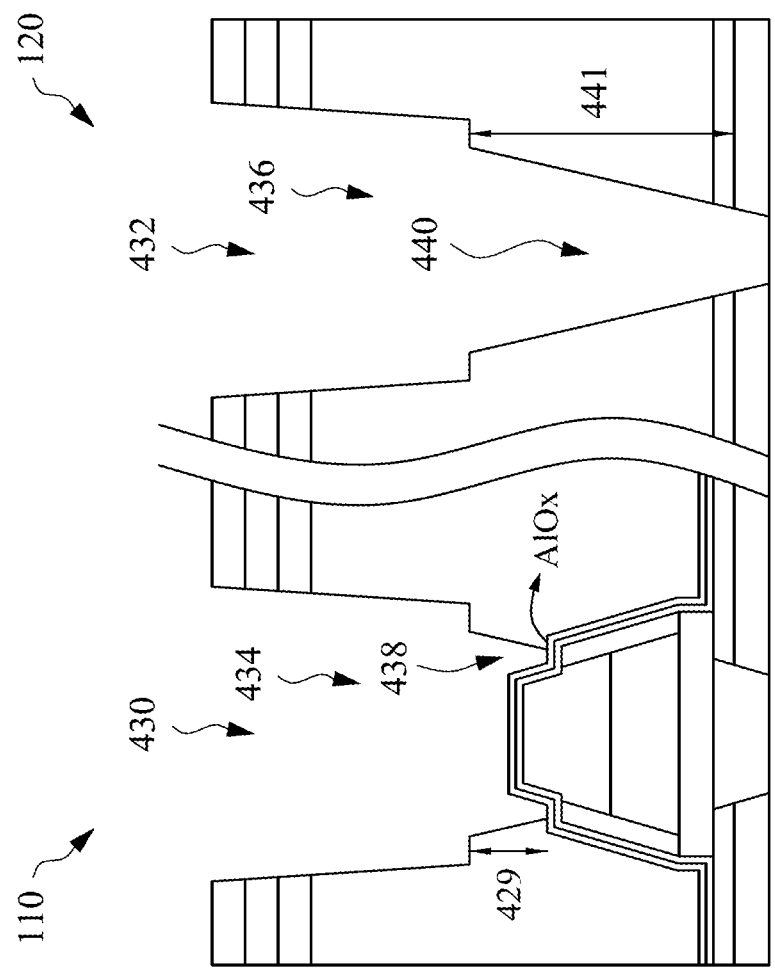

In FIG. 4G, a main etch process is implemented through the apertures 420, 422 to form via holes 430 leading to the MRAM cell 112 and via hole 432 leading to the metallization feature 118. The etch process also removes the SRO or TEOS layer 127 of the composite etch stop layer 125 in the second region 120. As such, the layer 404 of SiC, SiOC, or other dielectric layers formed using plasma enhanced ALD (PEALD) and the layer 129 of SiC functions as etch stop layer for the main etch process. In some embodiments, the main etch process uses a dry plasma etch process.

Due to the partial via holes 424, 426, the via holes 430, 432 each have a stagger shape and include a wider portion 434, 436, respectively, and a narrower portion 438, 440. The wide portions 434, 436 are proximal to the surface 410 of the ILD 123. The narrower portions 438, 440 are lower than the wider portions 434, 436 and are proximal to the MRAM cell 112 or the metallization features 118, respectively. In some embodiments, the wider portions 434, 436 have same dimensions, e.g., in surface area, in shape and in depth/length. The narrower portion 438 in the first region 110 has a shallower/shorter dimension 429 than the dimension 441 of the narrower portion 440 in the second region 120. As such, the SiC layer 404 over the MRAM cell 112 is exposed to more etchants than the SiC layer 129 in the second region 120. More SiC material is removed from the SiC layer 404 that is exposed in the via hole 430 than the SiC layer 129 that is exposed in the via hole 432. However, because the $AlO_x$ layer 402 has a high etching selectivity over SiC, the $AlO_x$ layer 402 remains covering the MRAM cell 112 including the top electrode 132, the MTJ structure 124, and the bottom electrode 128. On the other hand, because the SiC layer 404 encapsulates the $AlO_x$ layer 402 and is exposed to the etchants of the main etching process before the $AlO_x$ layer 402, the $AlO_x$ layer 402 does not need to maintain a relatively large thickness. Instead, the $AlO_x$ layer 402 has a relatively low thickness of about 2 Å to about 50 Å.

In some embodiments, the wider portions 434, 436 and the narrower portions 438, 440 all have a tapered shape behaving as the trenches filling the metal lines therein.

Figure 4H:
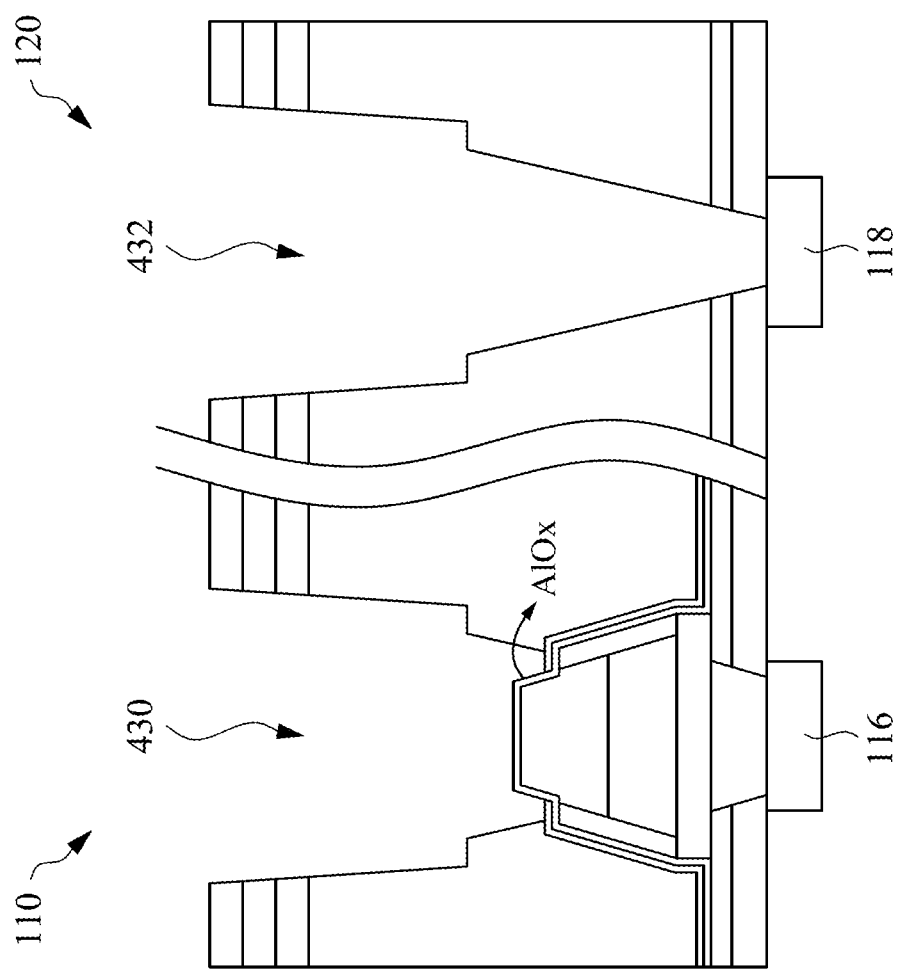

In FIG. 4H, a liner remove method (LRM) etching process is applied to remove a selective portion of the etch stop layer 129 of SiC downwardly from the via hole 432 and remove a selection portion of the SiC layer 404 downwardly from the via hole 430. Other etching techniques are also possible to be used in removing the SiC layers 127, 404. In some embodiments, the etching is highly anisotropic, wherein very little lateral etch is applied. This can be realized by lower pressure, e.g., smaller than 40 mTorr, and higher bias power, e.g., larger than 100 W. As the $AlO_x$ layer 402 has a high etching selectivity over the SiC, the $AlO_x$ layer 402 remain covering the MRAM cell 112 and is exposed in the via hole 430. In the second region 120, removal of the SiC layer 129 under the via hole 432 exposes the metallization feature 118 in the via hole 432.

Figure 4I:
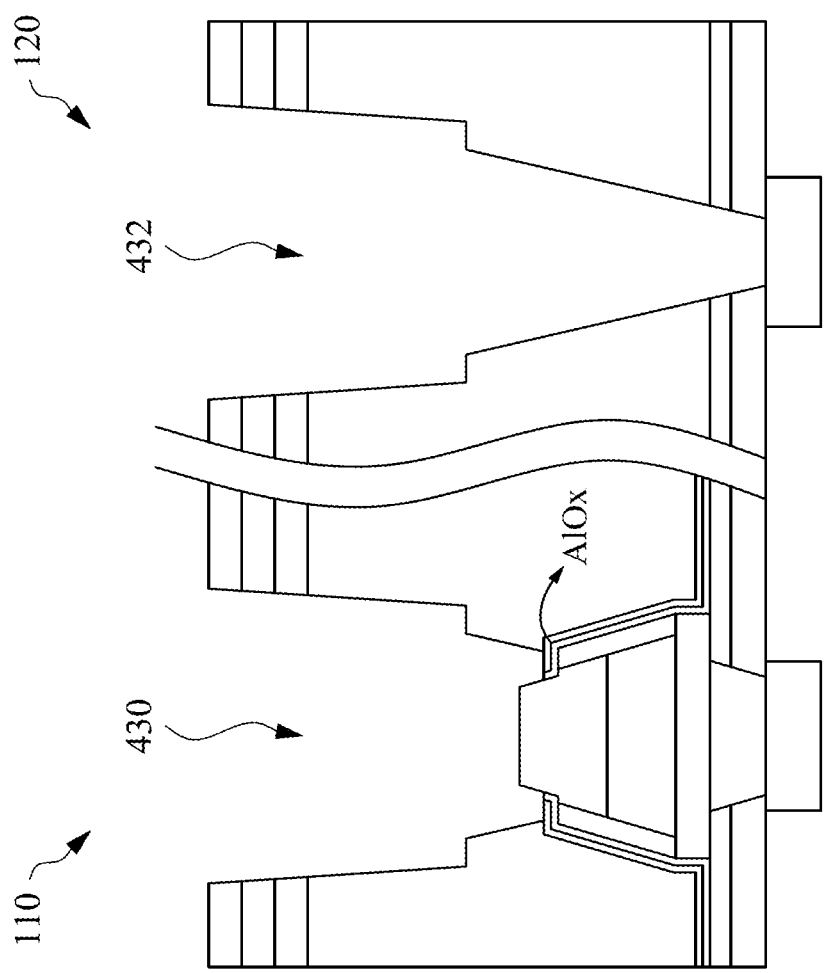

In FIG. 4I, a wet cleaning process is applied to the first region 110 and the second region 120 together. The wet cleaning, e.g., using deionized water, removes the $AlO_x$ layer 402 exposed in the via hole 430 and removes the debris and residuals in the via hole 432. The wet cleaning will not damage or affect the metallization feature 118, e.g., of copper, exposed in the via hole 432, and will not damage or affect the top electrode 132, e.g., of tungsten. Because of the relatively small thickness, about 2 Å to about 50 Å of the AlO$_x$ layer 402, it is relatively easier or faster to remove the portion of AlO$_x$ layer 402 through wet cleaning. As such, the removal of the AlO$_x$ layer 402 will not bring about additional time cost in the fabrication process as the wet cleaning is also implemented to clean the debris and residuals in the via hole 432. After the portion of AlO$_x$ layer 402 exposed in the via hole 430 has been removed, the remaining layers 402, 404 become protection layers 142, 144 of FIG. 1.

Figure 4J:
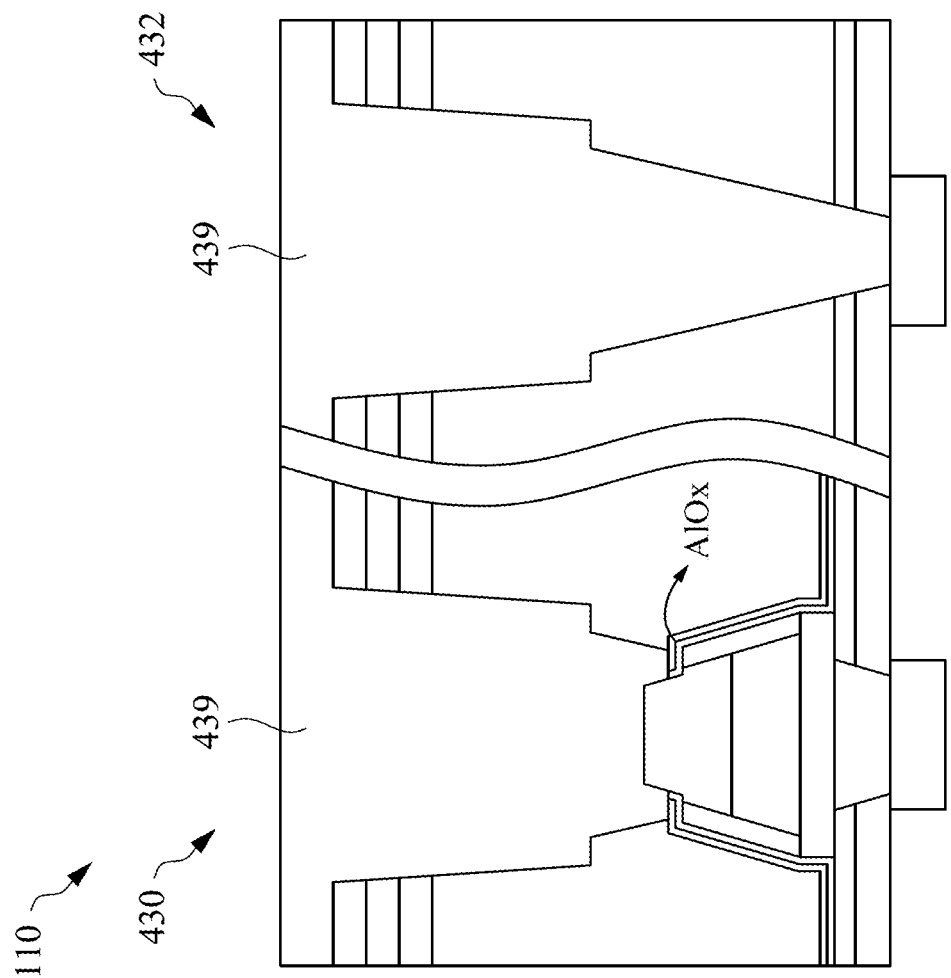

In FIG. 4J, a conductive material 439, e.g., copper, is deposited into the via holes 430, 432 together, which extends downwardly to the top electrode 132 and to the metallization feature 118, respectively. Because the sidewalls of the MTJ structure 124 and the top electrode 132 are covered by the remaining layers 402, 404, even if the via holes 430 misaligns and the conductive material 439 is deposited over the sidewalls of the top electrode 132 and the MTJ structure 124, the sidewall of the MTJ structure 124 will not be damaged or affected. As such, the via hole 430 can have more allowance and flexibility in surface dimensions. Given that the via holes 430, 432 are formed together, such allowance and flexibility also benefits the process design of the via hole 432.

Figure 4K:
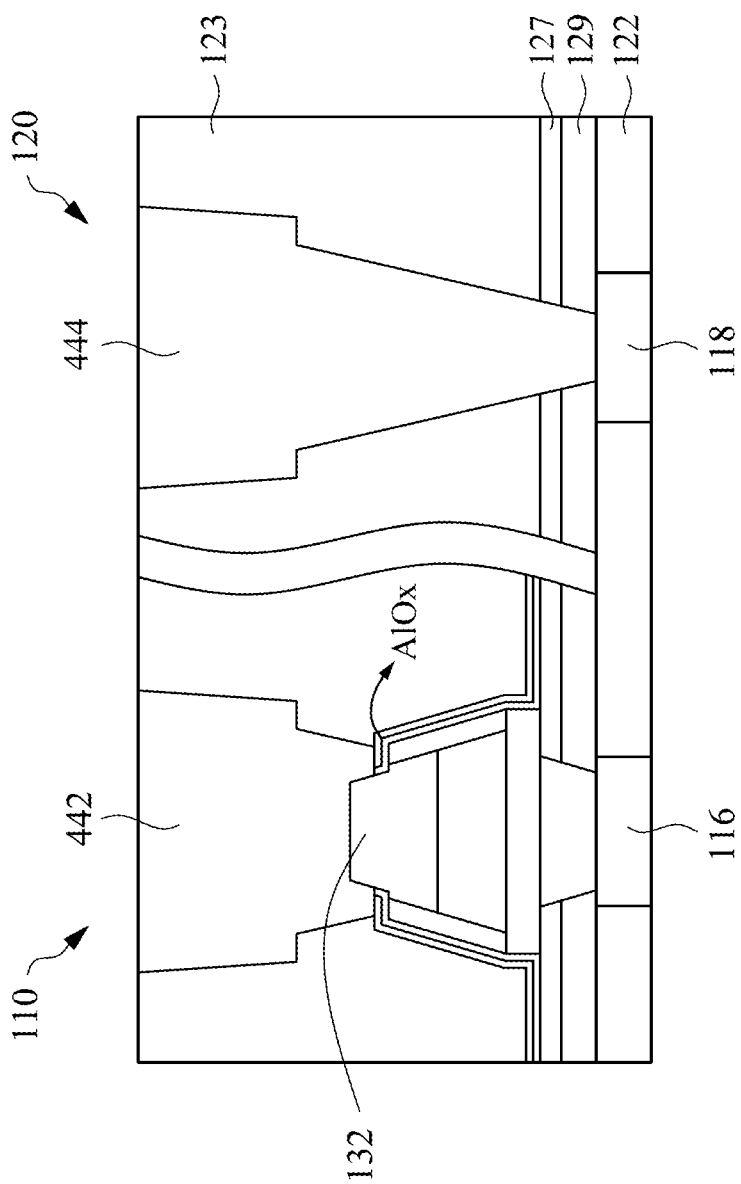

In FIG. 4K, a chemical-mechanical polish is applied to remove layers above the top surface 410 of the ILD layer 123, which include the excessive conductive material 439, the hard mask layer 414, the NFARC layer 412 and the sacrificial dielectric hardmask layer 416. Conductive material in the via hole 430 becomes an interconnection structure 442 to the top electrode 132 of the MRAM cell 112. Conductive material in the via hole 432 becomes an interconnection structure 444 to the metallization feature 118 in the second region 120.

As shown herein, with the layers 402, 404 encapsulating the MRAM cell 112, the processes of forming the interconnection structure 442 to the MRAM cell 112 in the first region 110 and forming the interconnection structure 444 to the metallization feature 118 in the second region 120 are integrated in a same process. None of the first region 110 or the second region 120 is covered in the process of forming the interconnection structure in the other region. Such integrated process saves cost and time in the BEOL processes. Further, the layers 402, 404 protect the MRAM cell 112 from being damaged in the process of forming the interconnect structure 442.

The present disclosure may be further appreciated with the description of the following embodiments:

In some embodiments, an integrated circuit includes a vertical magnetic tunnel junction stack having a first magnetic layer, a second magnetic layer and a barrier layer between the first magnetic layer and the second magnetic layer; a first electrode below the vertical magnetic tunnel junction stack; a second electrode over the vertical magnetic tunnel junction stack; a first dielectric layer laterally enveloping the vertical magnetic tunnel junction stack; and a second dielectric layer laterally enveloping the first dielectric layer.

In some embodiments, a method includes forming a first dielectric layer selectively over a first area of a wafer, the first area including a vertical magnetic tunnel junction structure over an etch stop layer, the etch stop layer extending through a second area of the wafer that is laterally besides the first area; forming a second dielectric layer selectively over the first area of the wafer and encapsulating the first dielectric layer; forming a third dielectric layer over the first area and the second area of the wafer and encapsulating the second dielectric layer; in a first etch operation, forming a first hole in the third dielectric layer exposing a first portion of the second dielectric layer over the vertical magnetic tunnel junction structure together with a second hole exposing a second portion of the etch stop layer in the second area; in a second etch operation, removing the first portion of the second dielectric layer exposed from the first hole and exposing a third portion of the first dielectric layer through the first hole together with removing the second portion of the etch stop layer exposed from the second hole; removing the third portion of the first dielectric layer through wet cleaning; and forming a first interconnect structure in the first hole contacting the vertical magnetic tunnel junction structure together with a second interconnect structure in the second hole extending through the etch stop layer.

In some embodiments, an integrated circuit includes a substrate; a first inter-level dielectric layer over the substrate; a first metallization feature and a second metallization feature in the first inter-level dielectric layer; an etch stop layer over the first inter-level dielectric layer; a second inter-level dielectric layer over the etch stop layer; a vertical magnetic tunnel junction stack in the second inter-level dielectric layer, the vertical magnetic tunnel junction stack having a first magnetic layer, a second magnetic layer and a barrier layer vertically between the first magnetic layer and the second magnetic layer; a first protection layer surrounding a sidewall of the vertical magnetic tunnel junction stack; a second protection layer surrounding the first protection layer; a first electrode below the vertical magnetic tunnel junction stack, extending through the etch stop layer and contacting the first metallization feature; a second electrode over the vertical magnetic tunnel junction stack; a first interconnection structure extending from a surface of the second inter-level dielectric layer to the second electrode; and a second interconnection structure extending from the surface of the second inter-level dielectric layer to the second metallization feature.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a vertical magnetic tunnel junction stack having a first magnetic layer, a second magnetic layer and a barrier layer between the first magnetic layer and the second magnetic layer;
a first electrode below the vertical magnetic tunnel junction stack, the first electrode including a top surface, the top surface including a first region in contact with the vertical magnetic tunnel junction stack, and a second region, the first and second region being an entirety of the top surface;

a second electrode over the vertical magnetic tunnel junction stack;
a first dielectric layer laterally enveloping the vertical magnetic tunnel junction stack and a part of the second electrode adjacent to the vertical magnetic tunnel junction stack, and the first dielectric layer in direct contact with the second electrode;
a second dielectric layer laterally enveloping the first dielectric layer;
a third dielectric layer over, and laterally enveloping the second dielectric layer; and
a spacer layer laterally between the first dielectric layer and the vertical magnetic tunnel junction stack, wherein a bottom surface of the spacer layer is in contact with the top surface of the first electrode, and the bottom surface of the spacer layer fully covers the second region.

2. The integrated circuit of claim 1, further comprising a first interconnect structure landing on a top surface of the second electrode, wherein the first interconnect structure is in contact with a top surface of the first dielectric layer.

3. The integrated circuit of claim 1, wherein the first dielectric layer has an etch selectivity over the second dielectric layer.

4. The integrated circuit of claim 1, wherein the spacer layer laterally envelopes the second electrode at least partially.

5. The integrated circuit of claim 1, wherein the second dielectric layer includes oxide rich silicon carbide, and the first dielectric layer has a high etching selectivity over the second dielectric layer.

6. The integrated circuit of claim 1, wherein the vertical magnetic tunnel junction stack is positioned over an etch stop layer below the third dielectric layer, and wherein the second dielectric layer includes a dielectric material that is capable of being etched out using a same etchant as the etch stop layer.

7. The integrated circuit of claim 6, wherein the second dielectric layer includes the same material as the etch stop layer.

8. The integrated circuit of claim 1, further comprising a first interconnect structure that contacts the second electrode through a first hole in the first dielectric layer and the second dielectric layer and vertically contacts the second dielectric layer.

9. The integrated circuit of claim 8, further comprising a second interconnect structure extending through the third dielectric layer and the etch stop layer and beside the vertical magnetic tunnel junction stack.

10. The integrated circuit of claim 9, wherein the first interconnect structure vertically contacts the first dielectric layer.

11. The integrated circuit of claim 1, wherein the first dielectric layer is one or more of aluminum oxide or aluminum nitride.

12. An integrated circuit, comprising:
a substrate;
a first inter-level dielectric layer over the substrate;
a first metallization feature and a second metallization feature in the first inter-level dielectric layer;
an etch stop layer over the first inter-level dielectric layer;
a second inter-level dielectric layer over the etch stop layer;
a vertical magnetic tunnel junction stack in the second inter-level dielectric layer, the vertical magnetic tunnel junction stack having a first magnetic layer, a second magnetic layer and a barrier layer vertically between the first magnetic layer and the second magnetic layer, the vertical magnetic tunnel junction stack including a first bottom surface;
a first protection layer surrounding a sidewall of the vertical magnetic tunnel junction stack;
a second protection layer surrounding the first protection layer;
a first electrode below the vertical magnetic tunnel junction stack, extending through the etch stop layer and contacting the first metallization feature;
a second electrode over the vertical magnetic tunnel junction stack, the second electrode extended through the first protection layer, and the first protection layer in direct contact with the second electrode;
a first interconnection structure extending from a surface of the second inter-level dielectric layer to the second electrode;
a second interconnection structure extending from the surface of the second inter-level dielectric layer to the second metallization feature; and
a spacer layer laterally between the first protection layer and the vertical magnetic tunnel junction stack, the first protection layer over and surrounding the spacer layer, the second protection layer over the first protection layer and the spacer layer, wherein a second bottom surface of the spacer layer is in contact with a top surface of the first electrode, and the second bottom surface of the spacer layer and the first bottom surface of the vertical magnetic tunnel stack fully cover the top surface of the first electrode.

13. The integrated circuit of claim 12, wherein the etch stop layer is one or more of SiC or SiOC.

14. The integrated circuit of claim 12, wherein the first interconnection structure has a wide upper portion and a narrow bottom portion under the wide upper portion, a bottom surface of the wide upper portion is in contact with the second inter-level dielectric layer, and a width of the narrow bottom portion is greater than a width of the second electrode.

15. A structure, comprising:
a vertical magnetic tunnel junction stack;
a first electrode below the vertical magnetic tunnel junction stack;
a second electrode over the vertical magnetic tunnel junction stack;
a first dielectric layer laterally enveloping the vertical magnetic tunnel junction stack and laterally enveloping a part of the second electrode adjacent to the vertical magnetic tunnel junction stack, and the first dielectric layer in direct contact with the second electrode;
a second dielectric layer laterally enveloping the first dielectric layer and on a top surface of the first dielectric layer;
a third dielectric layer laterally enveloping the first and second dielectric layer;
an interconnect structure in the third dielectric layer, on the second electrode, and on the second dielectric layer; and
a spacer layer laterally between the first dielectric layer and the vertical magnetic tunnel junction stack, wherein a bottom surface of the spacer layer is in contact with a top surface of the first electrode, and the bottom surface of the spacer layer fully covers a region of the first electrode not covered by the vertical magnetic tunnel stack.

16. The structure of claim 15, wherein the first interconnect structure has extending portions downwardly protruding from a top surface of the second electrode, and a portion of the first dielectric layer is vertically sandwiched between the spacer layer and the extending portions of the first interconnect structure,
    wherein the spacer layer comprises silicon nitride, silicon carbide, silicon dioxide, silicon oxy-nitride, or silicon oxy-carbide.

17. The structure of claim 15, wherein the second dielectric layer includes oxide rich silicon carbide, and the first dielectric layer has a high etching selectivity over the second dielectric layer.

18. The structure of claim 15, wherein the interconnect structure abuts both the first dielectric layer and the second dielectric layer.

19. The structure of claim 15, wherein the second dielectric layer is laterally adjacent to the first electrode.

20. The structure of claim 15, comprising:
    an etch stop layer below the first electrode; and
    a via structure in the etch stop layer and in contact with the first electrode.

\* \* \* \* \*